US012726041B2

(12) United States Patent
Matsumura et al.

(10) Patent No.: US 12,726,041 B2
(45) Date of Patent: Sep. 1, 2026

(54) CURRENT AND HEAT BALANCING CONSTANT VOLTAGE CHARGING

(71) Applicant: Intel Corporation, Santa Clara, CA (US)

(72) Inventors: Naoki Matsumura, San Jose, CA (US); Colin Carver, Hillsboro, OR (US); Tod Schiff, Portland, OR (US)

(73) Assignee: Intel Corporation, Santa Clara, CA (US)

(*) Notice: Subject to any disclaimer, the term of this patent is extended or adjusted under 35 U.S.C. 154(b) by 114 days.

(21) Appl. No.: 17/942,392

(22) Filed: Sep. 12, 2022

(65) Prior Publication Data

US 2024/0088701 A1 Mar. 14, 2024

(51) Int. Cl.

*H02J 7/00* (2026.01)
*G01R 31/389* (2019.01)
*H02J 7/62* (2026.01)
*H02J 7/64* (2026.01)
*H02J 7/82* (2026.01)
*H02J 7/90* (2026.01)
*H02J 7/96* (2026.01)

(52) U.S. Cl.

CPC .............. *H02J 7/96* (2026.01); *G01R 31/389* (2019.01); *H02J 7/62* (2026.01); *H02J 7/64* (2026.01); *H02J 7/82* (2026.01); *H02J 7/977* (2026.01)

(58) Field of Classification Search

USPC .......................................................... 320/107

See application file for complete search history.

(56) References Cited

U.S. PATENT DOCUMENTS

| | | | | |
|---|---|---|---|---|
| 5,969,508 A * | 10/1999 | Patino | H02J 7/94 320/144 |
| 2009/0051325 A1* | 2/2009 | Chorian | H02J 7/1423 320/136 |
| 2019/0229548 A1* | 7/2019 | Huang | H01M 10/46 |
| 2021/0046839 A1* | 2/2021 | Logvinov | B60L 53/63 |

FOREIGN PATENT DOCUMENTS

JP 2003134690 A * 5/2003

* cited by examiner

*Primary Examiner* — Samuel Berhanu

(74) *Attorney, Agent, or Firm* — Schwegman Lundberg & Woessner, P.A.

(57) ABSTRACT

A constant voltage may be used during battery charging to reduce or avoid the formation of a dendrite, such as a stepped constant voltage. For each charging period, each level of the stepped constant voltage may be calculated to ensure a corresponding current level within each period remains below a safe current limit. A voltage transition between any two periods may occur in response to expiration of a predetermined time, or in response to a determination that the current level has fallen below a lower current limit. A current level during each period may be maintained such that the battery heat is maintained below a reference heat level, which may increase battery cycle life (e.g., battery capacity or maximum recharging cycles). The battery heat may be measured directly or indirectly, or may be estimated based on other measured or controlled values.

16 Claims, 6 Drawing Sheets

CAPACITY (AH)

3.8
3.7
3.6
3.5
3.4
3.3
3.2

0
50
100
150
200
250

CYCLES

405 NO HEAT CONSIDERATION
410 HEAT CONSIDERATION
415 REFERENCE CONDITION

CURRENT AND HEAT BALANCING CONSTANT VOLTAGE CHARGING

TECHNICAL FIELD

Embodiments described herein generally relate to recharging batteries.

BACKGROUND

In a rechargeable battery, a lithium ion (e.g., Li-ion) battery with Li-metal anode (e.g., Li-metal battery) may provide a longer battery life than that comparable graphite anode batteries, such as a battery life increase of 20% or more. However, when charging a Li-ion battery, the Li-metal anodes may grow a dendrite that may cause a short-circuit. What is needed is improved charging for Li-metal batteries.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

A constant voltage may be used during battery charging to reduce or avoid the formation of a dendrite, such as a stepped constant voltage. For each charging period, each level of the stepped constant voltage may be calculated to ensure a corresponding current level within each period remains below a safe current limit. A voltage transition between any two periods may occur in response to expiration of a predetermined time, or in response to a determination that the current level has fallen below a lower current limit. A current level during each period may be maintained such that the battery heat is maintained below a reference heat level, which may increase battery cycle life (e.g., battery capacity or maximum recharging cycles). The battery heat may be measured directly or indirectly, or may be estimated based on other measured or controlled values.

In the following description, for purposes of explanation, numerous specific details are set forth to provide a thorough understanding of some example embodiments. It will be evident, however, to one skilled in the art that the present disclosure may be practiced without these specific details.

Figure 1A:
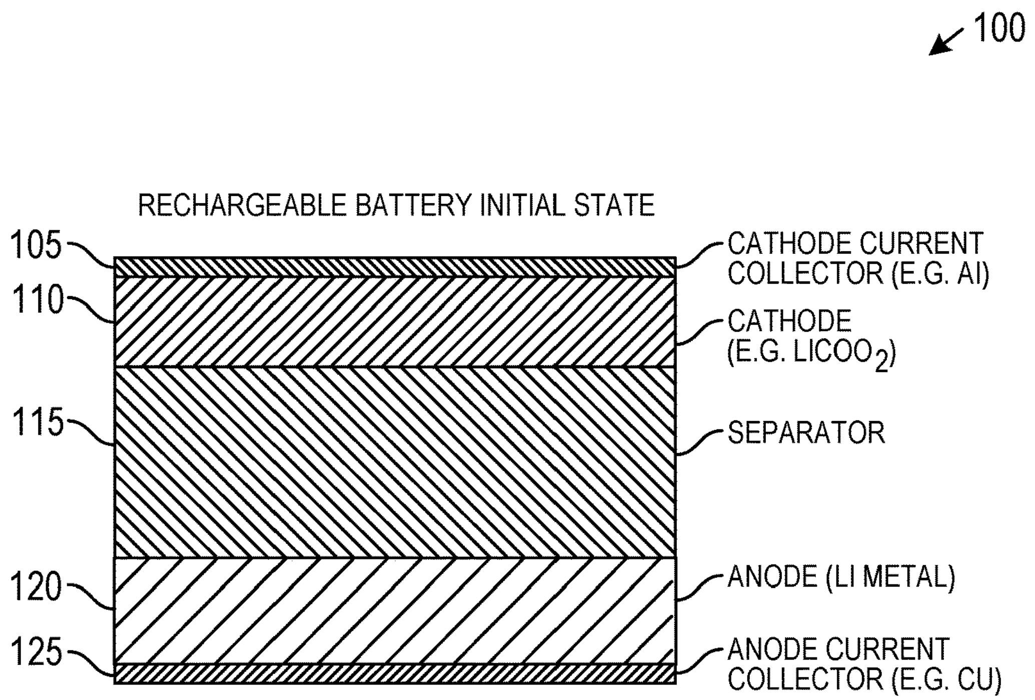
FIGS. 1A-1B are a block diagrams illustrating a multilayer Li-metal battery, according to an embodiment.
Figure 1B:
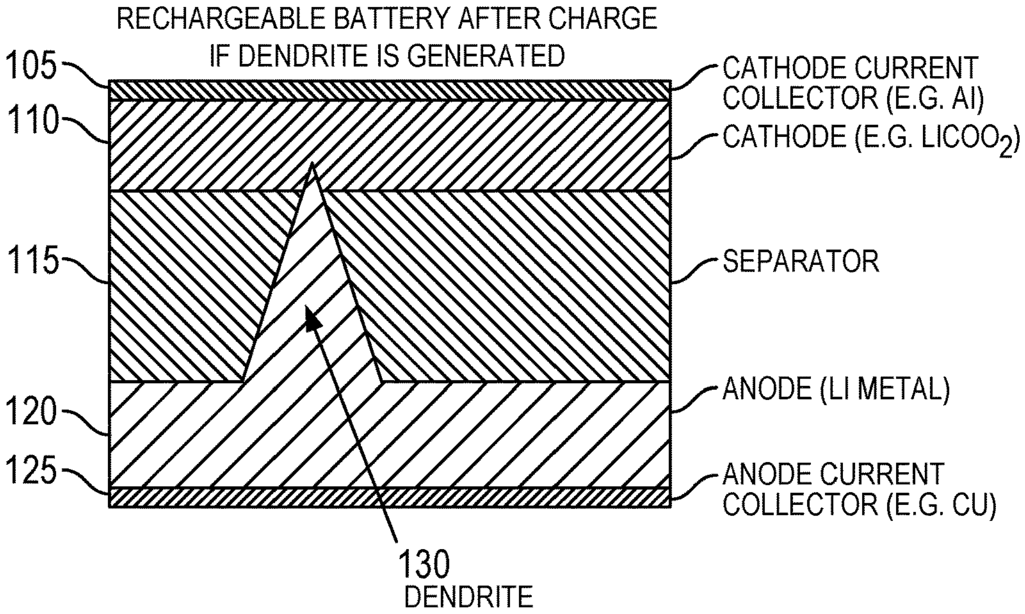

FIGS. 1A-1B are a block diagrams illustrating a multilayer Li-metal battery 100, according to an embodiment. FIG. 1A shows a rechargeable battery initial state, which includes a cathode current collector 105, a cathode 110, a separator 115, an anode 120, and an anode current collector

125. Charging of the multilayer Li-metal battery 100 is similar to electroplating of lithium to an anode, such as anode 120. The Li-metal may build up on a portion of the anode 120, forming a lithium deposit. FIG. 1B shows the same rechargeable battery after a charge that caused a Li-metal dendrite 130 to form from the anode 120 through the separator 115 into the cathode 110. This dendrite 130 may cause a short-circuit between the anode 120 and the cathode 110. While the solutions described herein are discussed in the context of Li-metal rechargeable batteries, these technical solutions may be applied to any rechargeable battery where dendrite formation or battery health is a concern.

Figure 2:
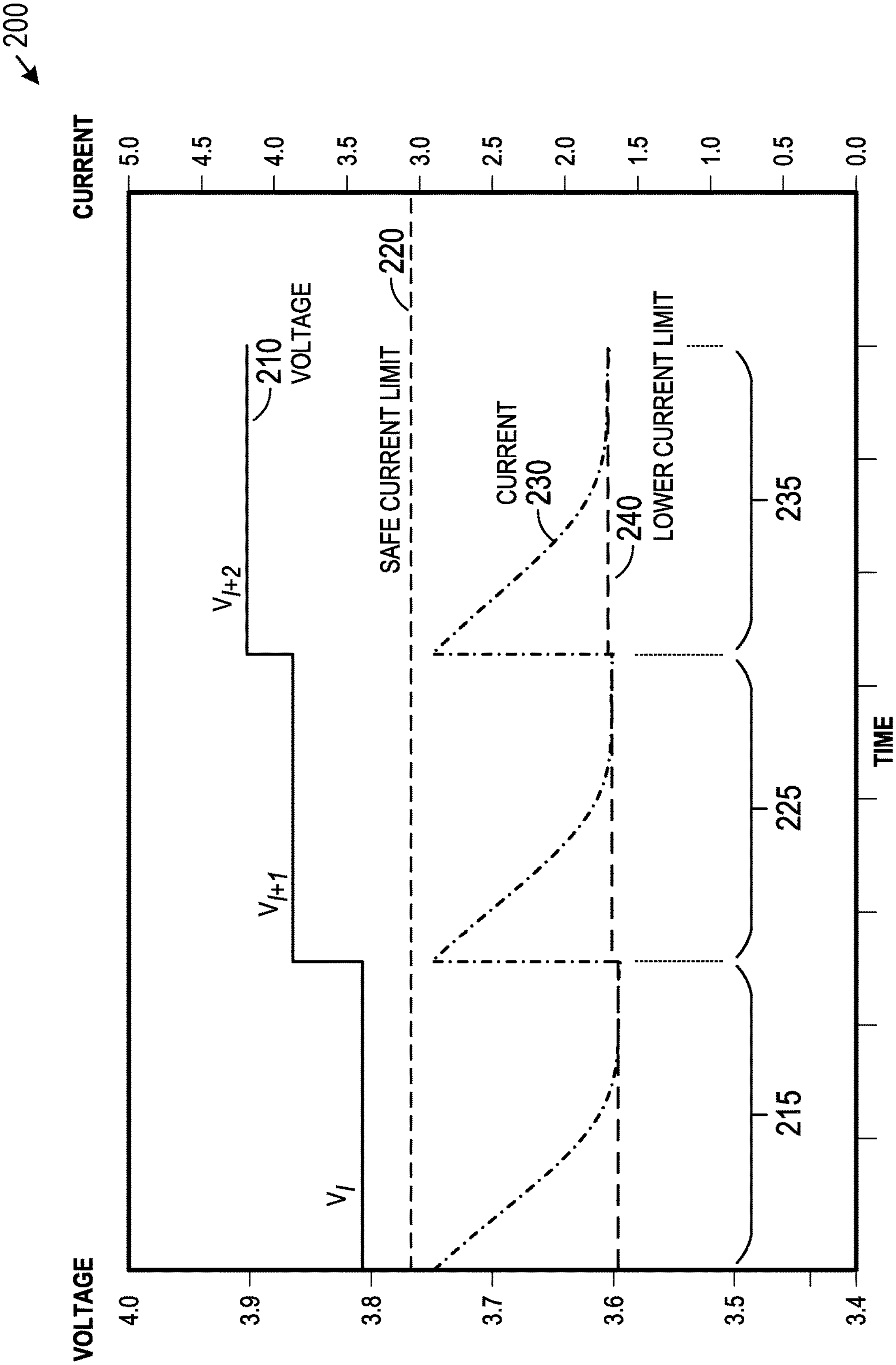
FIG. 2 is a graph illustrating a constant voltage charge step, according to an embodiment.

FIG. 2 is a graph illustrating a constant voltage charge step 200, according to an embodiment. A constant voltage may be used during battery charging to reduce or avoid the formation of a dendrite, such as stepped constant voltage 210. As shown in FIG. 2, stepped constant voltage 210 includes a first voltage level that is constant during a first period 215, a second voltage level that is constant during a second period 225, and a third voltage level that is constant during a third period 235.

For each period, each level of the stepped constant voltage 210 may be calculated as $V_i - V_{(OCV,i)} <= I_{limit} * R_i$, where $V_{(OCV,i)}$ is battery open circuit voltage at i % state of charge, $I_{limit}$ is safe current limit 220, and $R_i$ is battery impedance at i % state of charge. By calculating the stepped constant voltage 210 for each period, the current level 230 within each period remains below the safe current limit 220, then decreases asymptotically during the remainder of the charging period to a lower current limit 240.

The stepped constant voltage 210 may transition between first period 215 and second period 225 in response to one or more events. The transition between any two periods may occur in response to expiration of a predetermined time associated with one of those periods. In an example, each of the first period 215, the second period 225, and the third period 235 may be a sixty-second charging interval. In another example, the first period 215 may be longer than the second period 225, which may be longer than the third period 235. The transition between any two periods may occur in response to a determination that the current level 230 has fallen below the lower current limit 240. The lower current limit 240 may be set to a constant current value for all periods, or may increase in each successive period.

Figure 3:
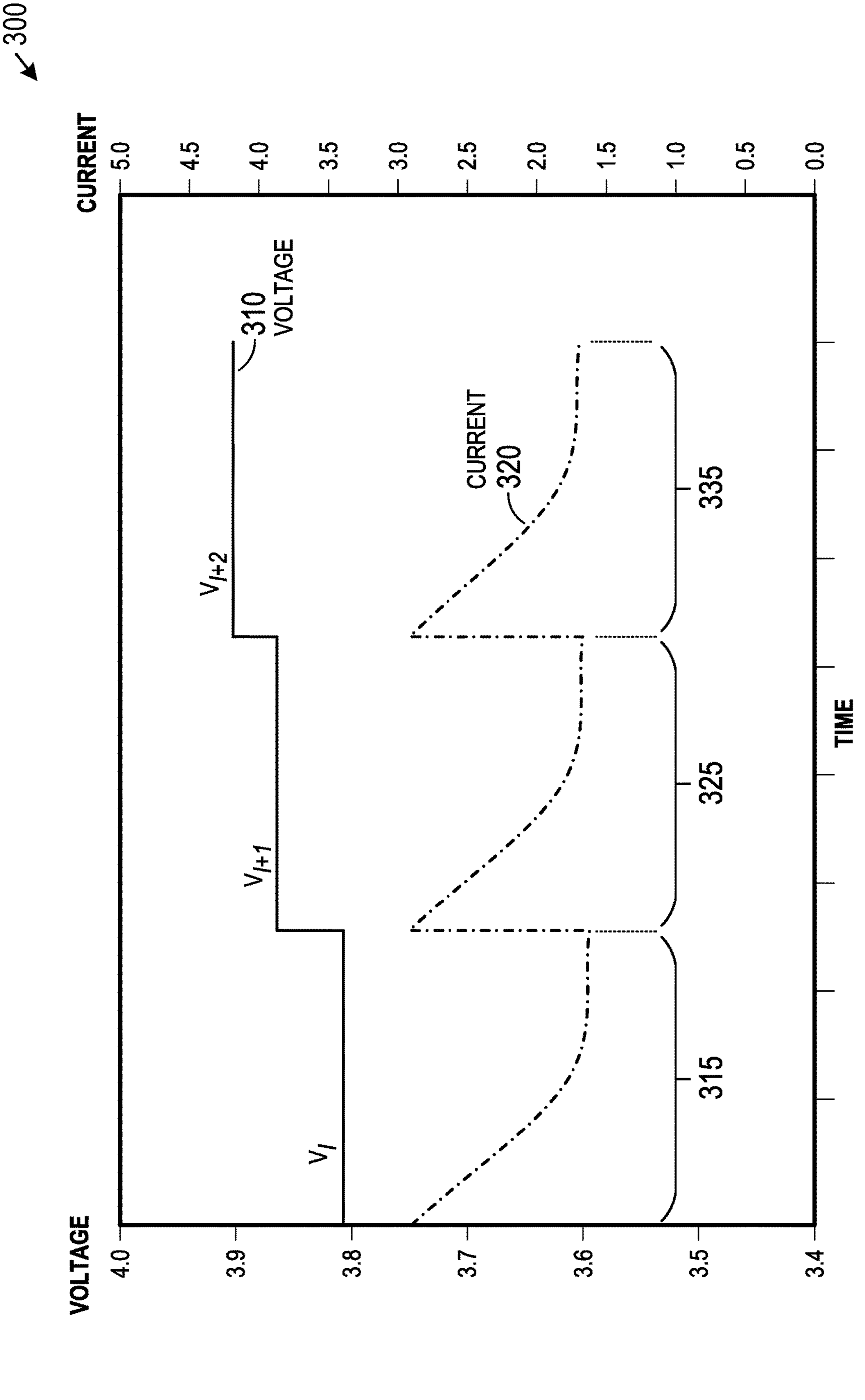
FIG. 3 is a graph illustrating a reference heat voltage charge step, according to an embodiment.

FIG. 3 is a graph illustrating a reference heat voltage charge step 300, according to an embodiment. As shown in FIG. 3, the reference heat voltage charge step 300 shows a stepped voltage 310 and a corresponding current level 320. The stepped voltage 310 may include a first voltage level that is constant during a first period 315, a second voltage level that is constant during a second period 325, and a third voltage level that is constant during a third period 335.

Maintaining a battery heat below a reference heat level during recharging may increase battery cycle life (e.g., battery capacity or maximum recharging cycles), or may reduce or avoid the formation of a dendrite. The stepped voltage 310 and the corresponding current level 320 may be controlled such that the generated heat during any of the periods is less than the reference heat level. The battery heat may be measured directly or indirectly, or may be estimated based on other measured or controlled values. In an example, the stepped voltage 310 or the corresponding current level 320 may be controlled to maintain a battery voltage charging temperature below the reference heat level.

Battery heat is a function of the current applied to a battery during charging. For a given charging interval, the charging heat may be determined as $H(cha)=\Sigma(I_t^2 \times R_t \times t)$, where $I_t$ is the charging current at time t, $R_t$ is the battery impedance at time t, and t is the charge duration. The value of $I_t$ may be determined based on an average of current over a duration, such as the average value of corresponding current level 320 during the entirety of first period 315, an average of multiple current values during first period 315, or as an integral of the area under the current level 320 during the first period 315.

The charging heat H(cha) may be controlled by controlling one or more of the stepped voltage 310 and the corresponding current level 320 during each period. This may be used to ensure charging heat remains below a reference heat level (e.g., H(cha)≤H(ref)) during recharging. In one example, the reference heat H(ref) may be calculated as $I_{ref}^2 \times R \times t_{ref}$, where $I_{ref}$ is reference current (e.g., standard battery charging current provided by a battery specification), R is battery impedance, and $t_{ref}$ is duration of the current. In other examples, the reference heat H(ref) may employ an allowable thermal budget, an activation energy of battery degradation reaction, a maximum threshold value regardless of heat, or other battery charging factors.

The constant voltage charge step 200 shown in FIG. 2 may be used in combination with the reference heat voltage charge step 300. For example, the constant voltage stepped voltage 310 for a given period may be determined based on $V_i - V_{(OCV,i)} <= I_{limit} * R_i$, and a corresponding current may be selected such that $\Sigma(I_t^2 \times R_t \times t) = H(cha) \leq H(ref)$. By maintaining the charging heat H(cha) at or below the reference heat level H(ref), the battery capacity may decrease less over time and the number of battery cycles may increase, such as shown in FIG. 4.

Figure 4:
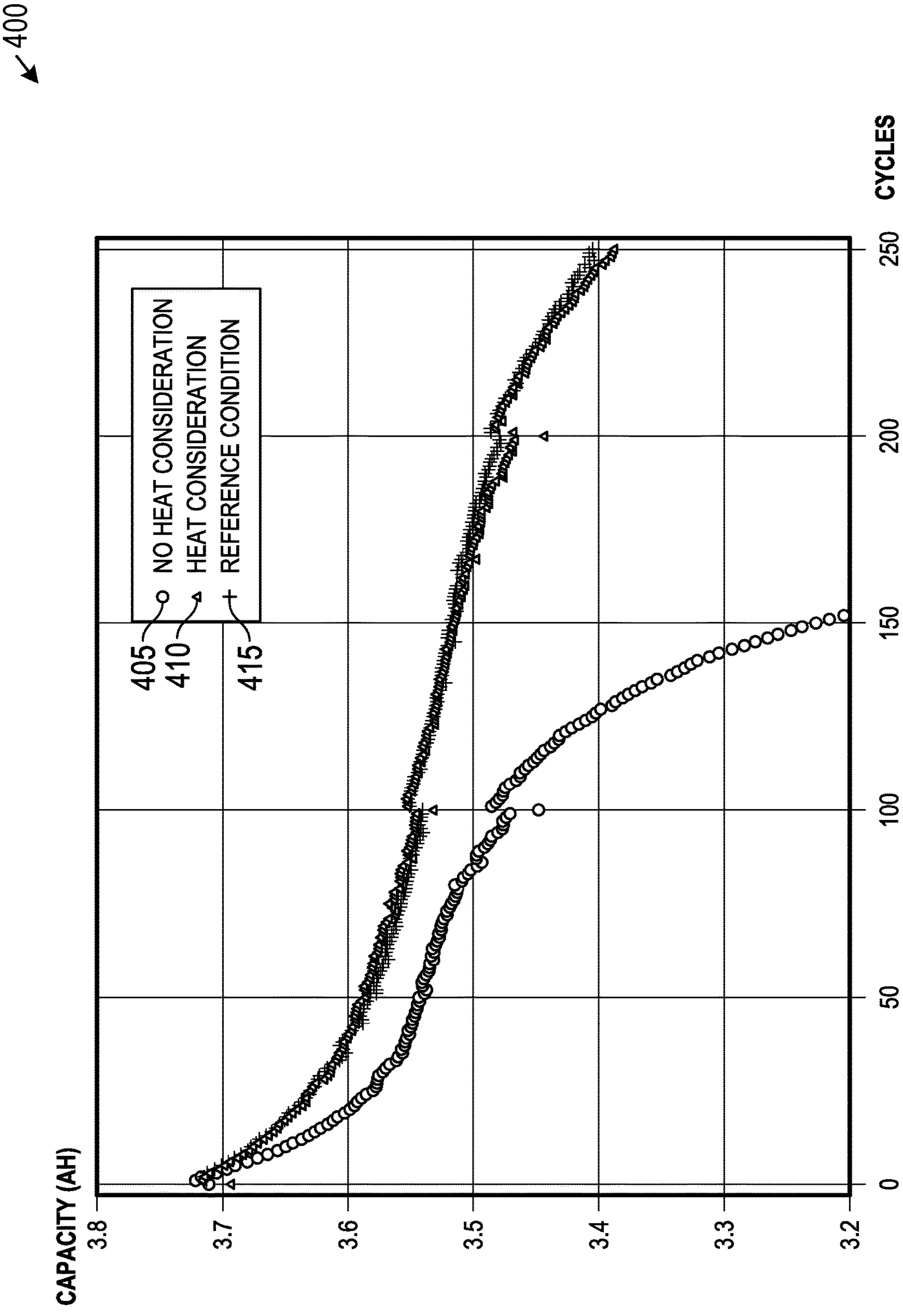
FIG. 4 is a graph illustrating a rechargeable battery health, according to an embodiment.

FIG. 4 is a graph illustrating a rechargeable battery health 400, according to an embodiment. The rechargeable battery capacity 400 shows a total battery capacity as a function of a number of charging/discharging cycles. As shown in FIG. 4, when the battery current is increased with no heat consideration 405 (e.g., H(cha)≤H(ref) is not maintained), the battery degradation is accelerated to reduce the battery capacity and maximum number of charging/discharging cycles. When the battery current is maintained based on the heat consideration 410 (e.g., maintaining H(cha)≤H(ref)), the battery capacity and number of charging/discharging cycles are significantly increased.

The results when using the heat consideration 410 are close to a reference condition 415. Reference condition 415 shows the expected capacity and number of charging/discharging cycles for that battery, which degrades naturally over repeated charging/discharging cycles based on the battery chemistry. When increased current is applied and is adjusted accordingly so that heat is less than or equal to the heat in the reference condition, even if the test condition includes increased current, battery degradation under heat consideration 410 is similar to that under reference condition reference condition 415. This current may be modified based on modifying discharging current or modifying charging current for constant voltage charging.

The constant voltage charging described herein adjusts charging one or more of voltage and current based on an instantaneous battery impedance, and may be modified further such that battery heat is the same as or less than a reference condition heat. This voltage or current adjustment during charging may be used to avoid or prevent dendrite formation, increase a battery lifetime capacity, or increase a maximum number of battery charging/discharging cycles.

The constant voltage charging may consist of one or more voltage steps. The battery impedance may be determined based on at least one of battery state-of-charge, current, duration of the current, temperature, and usage history. The battery impedance may be based on one or more of battery cell impedance, battery pack impedance, or alternative impedance values derived from cell or pack impedance.

To maintain the battery heat at or below a reference condition heat, one or more parameter derived from the heat or the heat over time period may be maintained to be the same as or less than one or more parameters derived from reference heat. For example, the battery impedance and time interval may be held constant, and the current may be adjusted. In various examples, the parameters may include one or more of $I^2*R*t$, $I^2*t$, $I^2*R$, where I is current, R is battery impedance and t is a duration of the application of the current. One or more of the parameters for the reference heat may be derived from thermal threshold, activation energy of a chemical reaction, activation energy of a battery degradation reaction, or a threshold value regardless of heat. One or more of the voltage or current adjustment may be based on one or more of power, current, duration, battery temperature, battery impedance, or impedance in power delivery.

Figure 5:
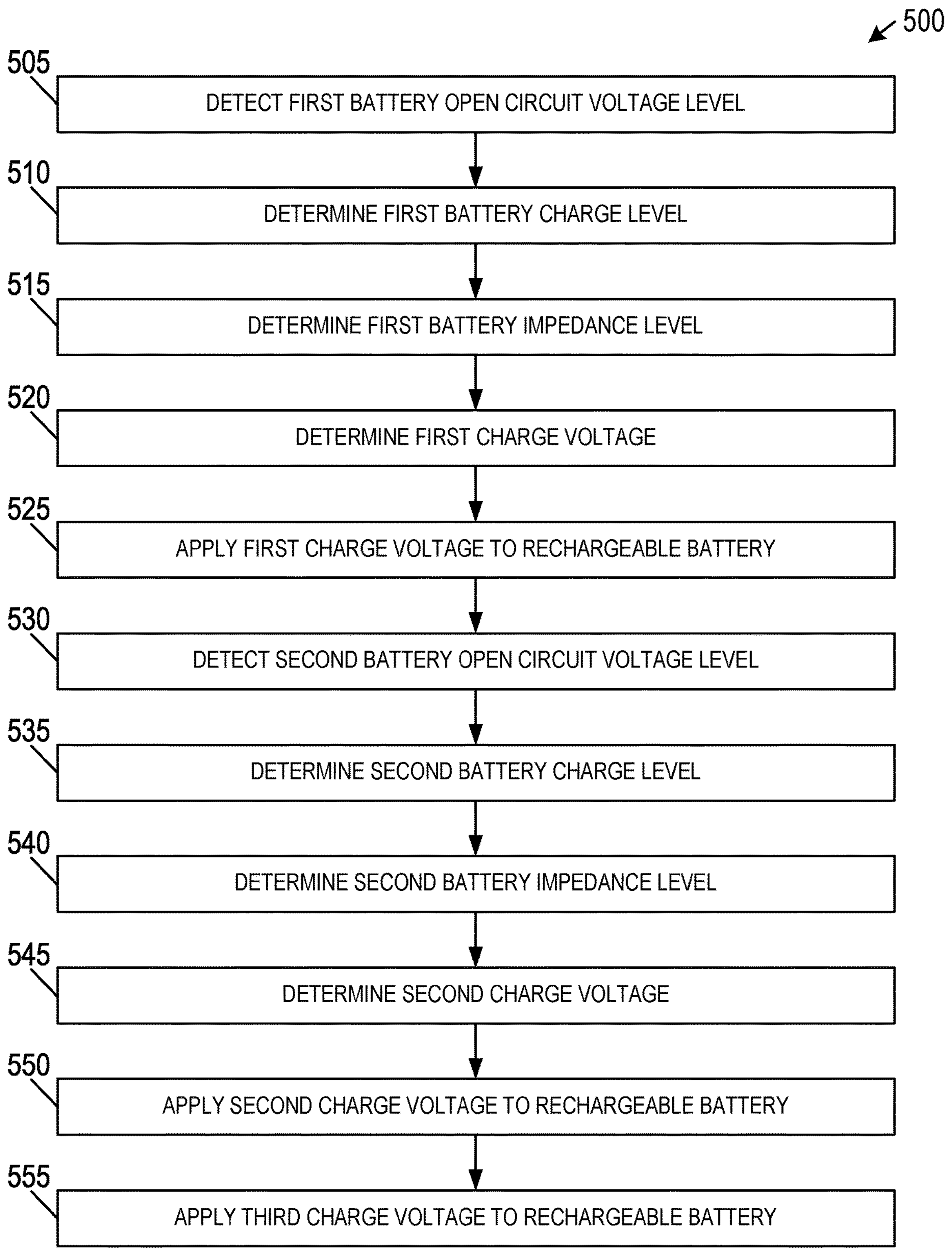
FIG. 5 is a flowchart illustrating a current and heat balancing method, according to an embodiment.

FIG. 5 is a flowchart illustrating a current and heat balancing method 500, according to an embodiment. Method 500 includes detecting 505, at a voltage level detector, a first battery open circuit voltage level of a rechargeable battery. Method 500 includes determining 510 a first battery charge level based on the first battery open circuit voltage level. Method 500 includes determining 515 a first battery impedance level based on the first battery charge level. Method 500 includes determining 520 a first charge voltage based on the first battery charge level, the first battery impedance level, and a safe charging current limit. Method 500 includes causing a battery charging circuit to apply 525 the first charge voltage to the rechargeable battery.

The first charge voltage may be determined to ensure a first charging current is below the safe charging current limit. The first charge voltage may be determined to ensure a difference between the first charge voltage and the first battery open circuit voltage level does not exceed a first product of the safe charging current limit and the first battery impedance level. The first charge voltage may be determined to ensure a first battery heat level is below a reference charging heat level. The reference charging heat level may be determined based on a product of a first charging period duration, the first battery impedance level, and a square of a specification battery charging current level. The first battery heat level may be determined as a sum over the first charging period duration of a first power level. The first power level may be determined as a second product of the first charging period duration, the first battery impedance level, and a square of a first average charging current during the first charging period duration.

Method 500 may further include causing the voltage level detector to detect 530 a second battery open circuit voltage level. Method 500 may further include determining 535 a second battery charge level based on the second battery open circuit voltage level. Method 500 may further include determining 540 a second battery impedance level based on the second battery charge level. Method 500 may further include determining 545 a second charge voltage based on the second battery charge level, the second battery impedance level, and the safe charging current limit. Method 500 may further include applying 550 the second charge voltage to the rechargeable battery. Causing the voltage level detector to detect the second battery open circuit voltage level may be responsive to expiration of a constant time interval.

Causing the battery charging circuit to apply 550 the second charge voltage to the rechargeable battery may be responsive to detecting the second battery open circuit voltage level is above a voltage level increase threshold. Causing the battery charging circuit to apply 550 the second charge voltage to the rechargeable battery may be responsive to a determination that the current level has fallen below a lower current limit. Method 500 may further include causing the battery charging circuit to apply 555 a third charge voltage to the rechargeable battery, wherein a first difference between the third charge voltage and the second charge voltage may be less than a second difference between second charge voltage and the first charge voltage. In some embodiments, some steps may be skipped or replaced. For example, 535 may be performed without 530 by monitoring the charged capacity during the first charge voltage, adding it to the first battery charge level, and estimating the second charge level and the second battery open circuit voltage level.

Figure 6:
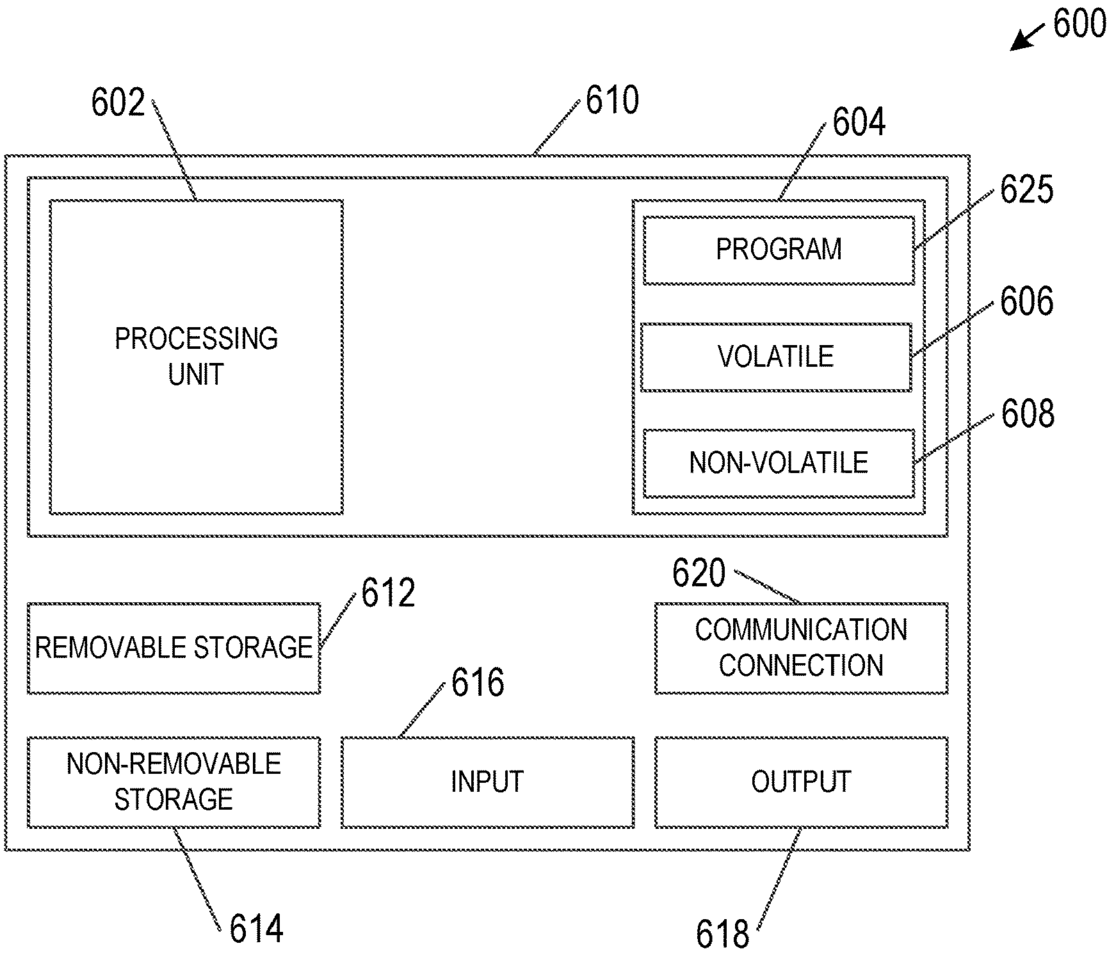
FIG. 6 is a block diagram of a computing device, according to an embodiment.

FIG. 6 is a block diagram of a computing device 600, according to an embodiment. The performance of one or more components within computing device 600 may be improved by including one or more of the circuits or circuitry methods described herein. Computing device 600 may include a rechargeable battery, a battery charging circuit, a voltage level detector to detect a first battery open circuit voltage level of the rechargeable battery, and a processing circuitry. The processing circuitry may be configured to determine a first battery charge level based on the first battery open circuit voltage level, determine a first battery impedance level based on the first battery charge level, determine a first charge voltage based on the first battery charge level, the first battery impedance level, and a safe charging current limit, and cause the battery charging circuit to apply the first charge voltage to the rechargeable battery.

In one embodiment, multiple such computer systems are used in a distributed network to implement multiple components in a transaction-based environment. An object-oriented, service-oriented, or other architecture may be used to implement such functions and communicate between the multiple systems and components. In some embodiments, the computing device of FIG. 6 is an example of a client device that may invoke methods described herein over a network. In some embodiments, the computing device of FIG. 6 is an example of one or more of the personal computer, smartphone, tablet, or various servers.

One example computing device in the form of a computer 610, may include a processing unit 602, memory 604, removable storage 612, and non-removable storage 614. Although the example computing device is illustrated and described as computer 610, the computing device may be in different forms in different embodiments. For example, the computing device may instead be a smartphone, a tablet, or other computing device including the same or similar elements as illustrated and described with regard to FIG. 6. Further, although the various data storage elements are illustrated as part of the computer 610, the storage may include cloud-based storage accessible via a network, such as the Internet.

Returning to the computer 610, memory 604 may include volatile memory 606 and non-volatile memory 608. Computer 610 may include or have access to a computing environment that includes a variety of computer-readable media, such as volatile memory 606 and non-volatile memory 608, removable storage 612 and non-removable storage 614. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 610 may include or have access to a computing environment that includes input 616, output 618, and a communication connection 620. The input 616 may include one or more of a touchscreen, touchpad, mouse, keyboard, camera, and other input devices. The input 616 may include a navigation sensor input, such as a GNSS receiver, a SOP receiver, an inertial sensor (e.g., accelerometers, gyroscopes), a local ranging sensor (e.g., LIDAR), an optical sensor (e.g., cameras), or other sensors. The computer may operate in a networked environment using a communication connection 620 to connect to one or more remote computers, such as database servers, web servers, and another computing device. An example remote computer may include a personal computer (PC), server, router, network PC, a peer device or other common network node, or the like. The communication connection 620 may be a network interface device such as one or both of an Ethernet card and a wireless card or circuit that may be connected to a network. The network may include one or more of a Local Area Network (LAN), a Wide Area Network (WAN), the Internet, and other networks.

Computer-readable instructions stored on a computer-readable medium are executable by the processing unit 602 of the computer 610. A hard drive (magnetic disk or solid state), CD-ROM, and RAM are some examples of articles including a non-transitory computer-readable medium. For example, various computer programs 625 or apps, such as one or more applications and modules implementing one or more of the methods illustrated and described herein or an app or application that executes on a mobile device or is accessible via a web browser, may be stored on a non-transitory computer-readable medium.

The apparatuses and methods described above may include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, the term “on” used with respect to two or more elements (e.g., materials), one “on” the other, means at least some contact between the elements (e.g., between the materials). The term “over” means the elements (e.g., materials) are in close proximity, but possibly with one or more additional intervening elements (e.g., materials) such that contact is possible but not required. Neither “on” nor “over” implies any directionality as used herein unless stated as such.

In the detailed description and the claims, a list of items joined by the term "at least one of" may mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A may include a single element or multiple elements. Item B may include a single element or multiple elements. Item C may include a single element or multiple elements.

In the detailed description and the claims, a list of items joined by the term "one of" may mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A may include a single element or multiple elements. Item B may include a single element or multiple elements. Item C may include a single element or multiple elements.

ADDITIONAL NOTES AND EXAMPLES

Example 1 is a system comprising: a rechargeable battery connection to receive a rechargeable battery; a battery charging circuit; and a processing circuitry to: receive a charging initiation indication; determine a first battery charge level responsive to the charging initiation indication; determine a first battery impedance level based on the first battery charge level; determine a first charge voltage based on the first battery charge level, the first battery impedance level, and a safe charging current limit; and cause the battery charging circuit to apply the first charge voltage to the rechargeable battery.

In Example 2, the subject matter of Example 1 includes, wherein the first charge voltage is determined to ensure a first charging current is below the safe charging current limit.

In Example 3, the subject matter of Examples 1-2 includes, a voltage level detector to detect a first battery open circuit voltage level of the rechargeable battery.

In Example 4, the subject matter of Example 3 includes, wherein the first charge voltage is determined to ensure a difference between the first charge voltage and the first battery open circuit voltage level does not exceed a first product of the safe charging current limit and the first battery impedance level.

In Example 5, the subject matter of Examples 3-4 includes, wherein the first battery charge level is determined based on the first battery open circuit voltage level.

In Example 6, the subject matter of Examples 1-5 includes, wherein the first charge voltage is determined to ensure a first battery heat level is below a reference charging heat level.

In Example 7, the subject matter of Example 6 includes, wherein the reference charging heat level is determined based on a product of a first charging period duration, the first battery impedance level, and a square of a specification battery charging current level.

In Example 8, the subject matter of Example 7 includes, wherein: the first battery heat level is determined as a sum over the first charging period duration of a first power level; and the first power level is determined as a second product of the first charging period duration, the first battery impedance level, and a square of a first average charging current during the first charging period duration.

In Example 9, the subject matter of Examples 3-8 includes, the processing circuitry further to: cause the voltage level detector to detect a second battery open circuit voltage level; determine a second battery charge level based on the second battery open circuit voltage level; determine a second battery impedance level based on the second battery charge level; determine a second charge voltage based on the second battery charge level, the second battery impedance level, and the safe charging current limit; and cause the battery charging circuit to apply the second charge voltage to the rechargeable battery.

In Example 10, the subject matter of Example 9 includes, wherein the processing circuitry causing the voltage level detector to detect the second battery open circuit voltage level is responsive to expiration of a constant time interval.

In Example 11, the subject matter of Examples 9-10 includes, wherein the processing circuitry causing the battery charging circuit to apply the second charge voltage to the rechargeable battery is responsive to at least one of detecting the second battery open circuit voltage level is above a voltage level increase threshold and determining that a battery charging current level has fallen below a lower current limit.

In Example 12, the subject matter of Examples 9-11 includes, the processing circuitry further to cause the battery charging circuit to apply a third charge voltage to the rechargeable battery.

In Example 13, the subject matter of Example 12 includes, wherein a first difference between the third charge voltage and the second charge voltage is less than a second difference between second charge voltage and the first charge voltage.

In Example 14, the subject matter of Examples 1-13 includes, wherein the charging initiation indication includes at least one of: receiving a command to initiate charging the rechargeable battery; receiving a charging voltage level from a newly connected external power source; and receiving a connection indication, the connection indication to indicate an attachment of the rechargeable battery to the rechargeable battery connection.

Example 15 is a method comprising: receiving a charging initiation indication to charge a rechargeable battery; detecting, at a voltage level detector, a first battery open circuit voltage level of the rechargeable battery; determining a first battery charge level based on the first battery open circuit voltage level; determining a first battery impedance level based on the first battery charge level; determining a first charge voltage based on the first battery charge level, the first battery impedance level, and a safe charging current limit; and causing a battery charging circuit to apply the first charge voltage to the rechargeable battery.

In Example 16, the subject matter of Example 15 includes, wherein the first charge voltage is determined to ensure a first charging current is below the safe charging current limit.

In Example 17, the subject matter of Examples 15-16 includes, wherein the first charge voltage is determined to ensure a difference between the first charge voltage and the first battery open circuit voltage level does not exceed a first product of the safe charging current limit and the first battery impedance level.

In Example 18, the subject matter of Examples 15-17 includes, wherein the first charge voltage is determined to ensure a first battery heat level is below a reference charging heat level.

In Example 19, the subject matter of Example 18 includes, wherein the reference charging heat level is determined based on a product of a first charging period duration, the first battery impedance level, and a square of a specification battery charging current level.

In Example 20, the subject matter of Example 19 includes, wherein: the first battery heat level is determined as a sum over the first charging period duration of a first power level; and the first power level is determined as a second product of the first charging period duration, the first battery impedance level, and a square of a first average charging current during the first charging period duration.

In Example 21, the subject matter of Examples 15-20 includes, causing the voltage level detector to detect a second battery open circuit voltage level; determining a second battery charge level based on the second battery open circuit voltage level; determining a second battery impedance level based on the second battery charge level; determining a second charge voltage based on the second battery charge level, the second battery impedance level, and the safe charging current limit; and applying the second charge voltage to the rechargeable battery.

In Example 22, the subject matter of Example 21 includes, wherein causing the voltage level detector to detect the second battery open circuit voltage level is responsive to expiration of a constant time interval.

In Example 23, the subject matter of Examples 21-22 includes, causing the battery charging circuit to apply the second charge voltage to the rechargeable battery is responsive to at least one of detecting the second battery open circuit voltage level is above a voltage level increase threshold and determining that a battery charging current level has fallen below a lower current limit.

In Example 24, the subject matter of Examples 21-23 includes, causing the battery charging circuit to apply a third charge voltage to the rechargeable battery.

In Example 25, the subject matter of Example 24 includes, wherein a first difference between the third charge voltage and the second charge voltage is less than a second difference between second charge voltage and the first charge voltage.

In Example 26, the subject matter of Examples 15-25 includes, wherein the charging initiation indication includes at least one of: receiving a command to initiate charging the rechargeable battery; receiving a charging voltage level from a newly connected external power source; and receiving a connection indication, the connection indication to indicate an attachment of the rechargeable battery.

Example 27 is at least one machine-readable medium including instructions that, when executed by processing circuitry, cause the processing circuitry to perform operations to implement of any of Examples 1-26.

Example 28 is an apparatus comprising means to implement of any of Examples 1-26.

Example 29 is a system to implement of any of Examples 1-26.

Example 30 is a method to implement of any of Examples 1-26.

The subject matter of any Examples above may be combined in any combination.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A system comprising:

a battery charging circuit configured to couple to a rechargeable battery;

a processing circuitry to:

receive a charging initiation indication;

determine a first battery charge level responsive to the charging initiation indication;

determine a first battery impedance level based on the first battery charge level;

determine a first charge voltage based on the first battery charge level, the first battery impedance level, and a predetermined charging current limit; and cause the battery charging circuit to apply the first charge voltage to the rechargeable battery; and a voltage level detector to detect a first battery open circuit voltage level of the rechargeable battery, wherein the first charge voltage is determined to ensure a difference between the first charge voltage and the first battery open circuit voltage level does not exceed a first product of the predetermined charging current limit and the first battery impedance level.

2. The system of claim 1, wherein the first charge voltage is determined to ensure a first charging current is below the predetermined charging current limit.

3. The system of claim 1, wherein the first battery charge level is determined based on the first battery open circuit voltage level.

4. The system of claim 1, wherein the first charge voltage is determined to ensure a first battery heat level is below a reference charging heat level.

5. The system of claim 4, wherein the reference charging heat level is determined based on a product of a first charging period duration, the first battery impedance level, and a square of a specification battery charging current level.

6. The system of claim 5, wherein:

the first battery heat level is determined as a sum over the first charging period duration of a first power level; and the first power level is determined as a second product of the first charging period duration, the first battery impedance level, and a square of a first average charging current during the first charging period duration.

7. The system of claim 1, the processing circuitry further to:

cause the voltage level detector to detect a second battery open circuit voltage level;

determine a second battery charge level based on the second battery open circuit voltage level;

determine a second battery impedance level based on the second battery charge level;

determine a second charge voltage based on the second battery charge level, the second battery impedance level, and the predetermined charging current limit; and cause the battery charging circuit to apply the second charge voltage to the rechargeable battery.

8. The system of claim 7, wherein the processing circuitry causing the voltage level detector to detect the second battery open circuit voltage level is responsive to expiration of a constant time interval.

9. The system of claim 7, wherein the processing circuitry causing the battery charging circuit to apply the second charge voltage to the rechargeable battery is responsive to at least one of detecting the second battery open circuit voltage level is above a voltage level increase threshold and determining that a battery charging current level has fallen below a lower current limit.

10. A method comprising:
- receiving a charging initiation indication to charge a rechargeable battery;
- detecting, at a voltage level detector, a first battery open circuit voltage level of the rechargeable battery;
- determining a first battery charge level based on the first battery open circuit voltage level;
- determining a first battery impedance level based on the first battery charge level;
- determining a first charge voltage based on the first battery charge level, the first battery impedance level, and a predetermined charging current limit; and
- causing a battery charging circuit to apply the first charge voltage to the rechargeable battery;
- wherein:
  - the first charge voltage is determined to ensure a first charging current is below the predetermined charging current limit; and
  - the first charge voltage is determined to ensure a difference between the first charge voltage and the first battery open circuit voltage level does not exceed a first product of the predetermined charging current limit and the first battery impedance level.

11. The method of claim 10, wherein the first charge voltage is determined to ensure a first battery heat level is below a reference charging heat level.

12. The method of claim 11, wherein the reference charging heat level is determined based on a product of a first charging period duration, the first battery impedance level, and a square of a specification battery charging current level.

13. The method of claim 12, wherein:
- the first battery heat level is determined as a sum over the first charging period duration of a first power level; and
- the first power level is determined as a second product of the first charging period duration, the first battery impedance level, and a square of a first average charging current during the first charging period duration.

14. The method of claim 10, further including:
- causing the voltage level detector to detect a second battery open circuit voltage level;
- determining a second battery charge level based on the second battery open circuit voltage level;
- determining a second battery impedance level based on the second battery charge level;
- determining a second charge voltage based on the second battery charge level, the second battery impedance level, and the predetermined charging current limit; and
- applying the second charge voltage to the rechargeable battery.

15. The method of claim 14, wherein causing the voltage level detector to detect the second battery open circuit voltage level is responsive to expiration of a constant time interval.

16. The method of claim 14, causing the battery charging circuit to apply the second charge voltage to the rechargeable battery is responsive to at least one of detecting the second battery open circuit voltage level is above a voltage level increase threshold and determining that a battery charging current level has fallen below a lower current limit.

* * * * *